(12) United States Patent
Sakai et al.

(10) Patent No.: US 10,218,345 B2
(45) Date of Patent: Feb. 26, 2019

(54) HIGH-SIDE GATE DRIVE CIRCUIT, SEMICONDUCTOR MODULE, AND THREE-PHASE INVERTER SYSTEM

(71) Applicant: Mitsubishi Electric Corporation, Tokyo (JP)

(72) Inventors: Shinji Sakai, Tokyo (JP); Hisashi Oda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/856,647

(22) Filed: Dec. 28, 2017

(65) Prior Publication Data

US 2018/0337666 A1 Nov. 22, 2018

(30) Foreign Application Priority Data

May 19, 2017 (JP) ................................. 2017-099697

(51) Int. Cl.
| | |
|---|---|
| *H03K 17/06* | (2006.01) |
| *H02M 7/537* | (2006.01) |
| *H03K 17/0812* | (2006.01) |
| *H03K 17/10* | (2006.01) |

(52) U.S. Cl.
CPC .......... *H03K 17/063* (2013.01); *H02M 7/537* (2013.01); *H03K 17/08128* (2013.01); *H03K 17/107* (2013.01)

(58) Field of Classification Search
CPC ................ H02M 7/537; H03K 17/063; H03K 17/08128; H03K 17/107

USPC ................. 326/82, 83, 84, 89; 327/108, 109
See application file for complete search history.

(56) References Cited

U.S. PATENT DOCUMENTS

| | | | |
|---|---|---|---|
| 6,353,345 B1 * | 3/2002 | Yushan | ................ H03K 17/063 326/80 |
| 6,538,481 B1 | 3/2003 | Suetsugu | |
| 6,774,674 B2 | 8/2004 | Okamoto et al. | |
| 9,100,019 B2 | 8/2015 | Akiyama | |
| 2003/0210081 A1 * | 11/2003 | Watabe | ................. H02M 7/538 327/108 |
| 2004/0212021 A1 * | 10/2004 | Shimizu | ................ H01L 27/088 257/375 |

(Continued)

FOREIGN PATENT DOCUMENTS

| | | |
|---|---|---|
| JP | 2003-079131 A | 3/2003 |
| JP | 2003-101391 A | 4/2003 |

(Continued)

*Primary Examiner* — William Hernandez
(74) *Attorney, Agent, or Firm* — Studebaker & Brackett PC

(57) ABSTRACT

A high-side gate drive circuit includes pulse generating circuits that generate a first pulse synchronized with an input signal, and level shift circuits that shift a level of a reference voltage for the first pulse to a power supply voltage of a high-side switching element. The level shift circuits include MOSFETs to be driven by the first pulse. The high-side gate drive circuit includes a mask signal generating circuit that generates a mask signal that becomes a high level in a period in which source potential of the MOSFETs becomes a high level, and reshot circuits that input, when the first pulse is input into the level shift circuits during a mask period that is a period in which the mask signal is a high level, a second pulse into the level shift circuits after the mask period.

13 Claims, 6 Drawing Sheets

(56) References Cited

U.S. PATENT DOCUMENTS

| | | | |
|---|---|---|---|
| 2012/0212270 A1* | 8/2012 | Ishimatsu | H03K 17/0822 327/198 |
| 2013/0207704 A1* | 8/2013 | Tseng | H03K 19/00361 327/194 |
| 2013/0265029 A1* | 10/2013 | Akiyama | H03K 17/94 323/311 |
| 2016/0079967 A1* | 3/2016 | Miwa | H03K 17/063 327/109 |

FOREIGN PATENT DOCUMENTS

| | | |
|---|---|---|
| JP | 2008-211337 A | 9/2008 |
| JP | 2013-219874 A | 10/2013 |

* cited by examiner

HIGH-SIDE GATE DRIVE CIRCUIT, SEMICONDUCTOR MODULE, AND THREE-PHASE INVERTER SYSTEM

BACKGROUND OF THE INVENTION

Field of the Invention

The present invention relates to a high-side gate drive circuit.

Description of the Background Art

A high voltage metal oxide semiconductor (MOS) gate driver IC (HVIC) is a high-withstand voltage IC that directly drives a gate with an input signal, such as a microprocessor. The HVIC includes a high-side gate drive circuit that drives a high-voltage side (high-side) switching element and a low-side gate drive circuit that drives a low-voltage side (low-side) switching element.

The high-side gate drive circuit generates an on-pulse synchronized with the rising of a high-side input signal HIN and an off-pulse synchronized with the falling of the high-side input signal HIN. Levels of reference voltages for the on-pulse and the off-pulse are shifted from GND to a high voltage by high-withstand voltage level shift MOSFETs. The on-pulse and the off-pulse are then transmitted to a latch circuit in a high-voltage side logic circuit, and are output from an output circuit to the high-side switching element. In this way, a pulse width of a gate drive signal for the high-side switching element is determined.

Conventional high-side gate drive circuits have a problem that when a high-side switching element turns on or off, a voltage change dV/dt between a high-side floating power supply offset voltage VS and the ground GND becomes noise, preventing normal signal transmission to a high-voltage side.

A method of avoiding influence of noise by making periods of the on-pulse and the off-pulse longer than a noise period has been conventionally proposed for this problem. Japanese Patent Application Laid-Open No. 2003-79131 proposes a method of avoiding influence of noise, by the on-pulse and the off-pulse each including a plurality of pulses having a predetermined period.

However, there is a problem that the on-pulse and the off-pulse having a period longer than the noise period will lead to increase in a loss made when a signal is transmitted to the high-side switching element. Also, when the on-pulse and the off-pulse each include a plurality of pulses, it is necessary to set the pulse period constant in advance, although the noise period varies depending on an operating environment of the high-side switching element. Therefore, in a case where the high-side input signal is a narrow-width pulse, signal transmission from the high-side input signal to the high-side switching element will be delayed excessively. Therefore, there is a problem that input of the narrow-width pulse is limited or dead time increases.

SUMMARY OF THE INVENTION

It is an object of the present invention to inhibit influence of noise while inhibiting a signal transmission loss and increase in delay time in the high-side gate drive circuit.

A high-side gate drive circuit according to the present invention drives a high-side switching element. The high-side gate drive circuit includes pulse generating circuits, level shift circuits, a mask signal generating circuit, and reshot circuits. The pulse generating circuits generate a first pulse synchronized with an input signal. The level shift circuits perform level shift of a reference voltage for the first pulse to a power supply voltage of the high-side switching element. The level shift circuits include MOSFETs to be driven by the first pulse. The mask signal generating circuit generates a mask signal that becomes a high level in a period in which source potential of the MOSFETs becomes a high level. When the first pulse is input into the level shift circuits during a mask period that is a period in which the mask signal is a high level, the reshot circuits input a second pulse into the level shift circuits after the mask period.

The high-side gate drive circuit of the present invention allows, when noise occurs, the input signal to be transmitted to the high-side switching element while avoiding influence of noise with the second pulse. Therefore, it is not necessary to make a period of the first pulse longer than the mask period in order to avoid influence of noise. Therefore, it is possible to inhibit influence of noise, while inhibiting increase in a signal transmission loss and delay time.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. Underlying Technology>

Figure 1:
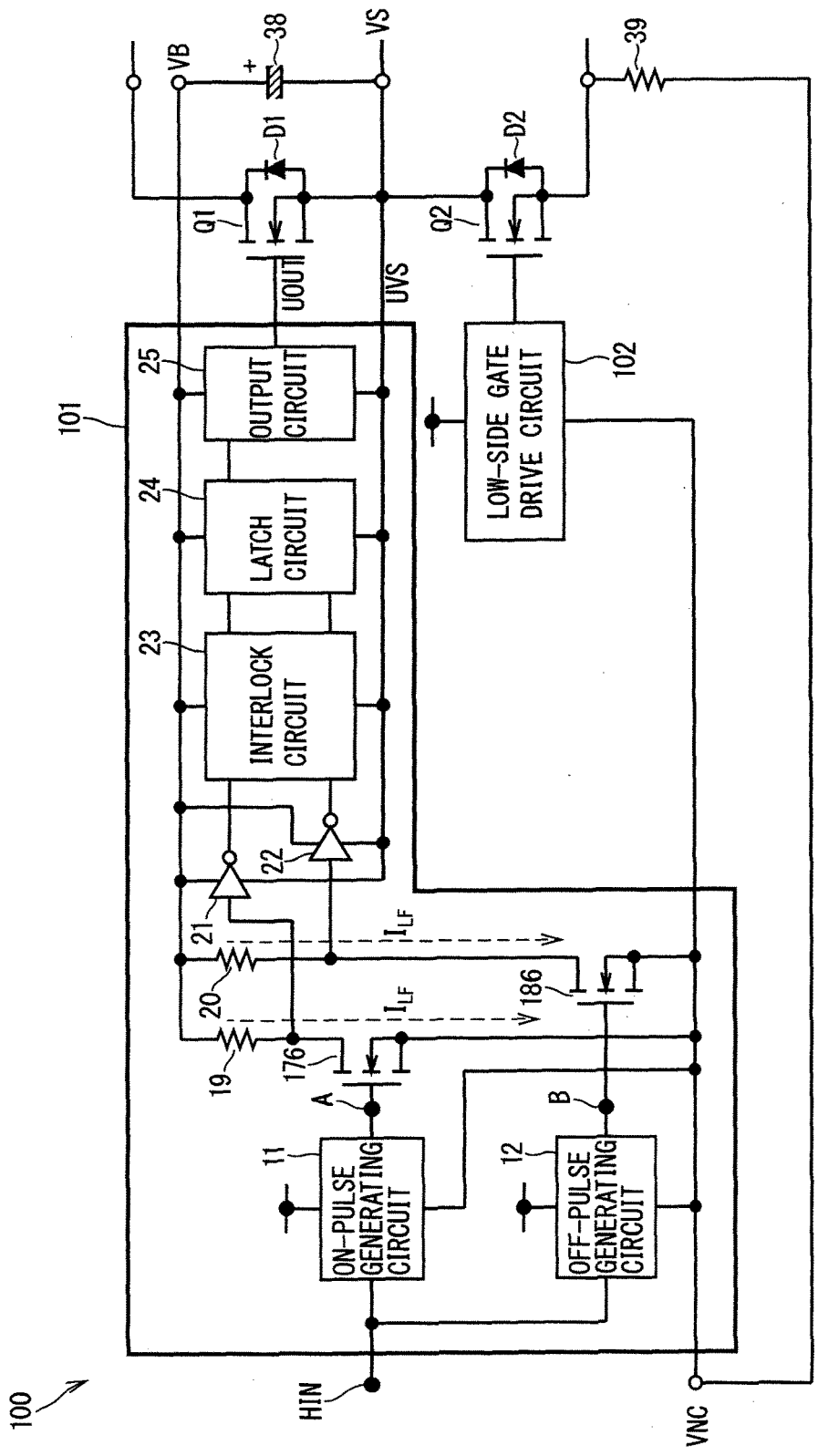
FIG. 1 is a circuit diagram of an HVIC of underlying technology.

FIG. 1 is a diagram illustrating an HVIC 100 of underlying technology. The HVIC 100 includes a high-side gate drive circuit 101 that drives a high-side switching element Q1, and a low-side gate drive circuit 102 that drives a low-side switching element Q2. Both of the high-side switching element Q1 and the low-side switching element Q2 are MOSFETs, to which freewheel diodes D1 and D2 are connected in inverse parallel.

A configuration of the high-side gate drive circuit 101 will be described below. The high-side gate drive circuit 101 includes an on-pulse generating circuit 11, an off-pulse generating circuit 12, level shift MOSFETs 176 and 186, resistors 19 and 20, NOT gates 21 and 22, an interlock circuit 23, a latch circuit 24, and an output circuit 25.

Figure 2:
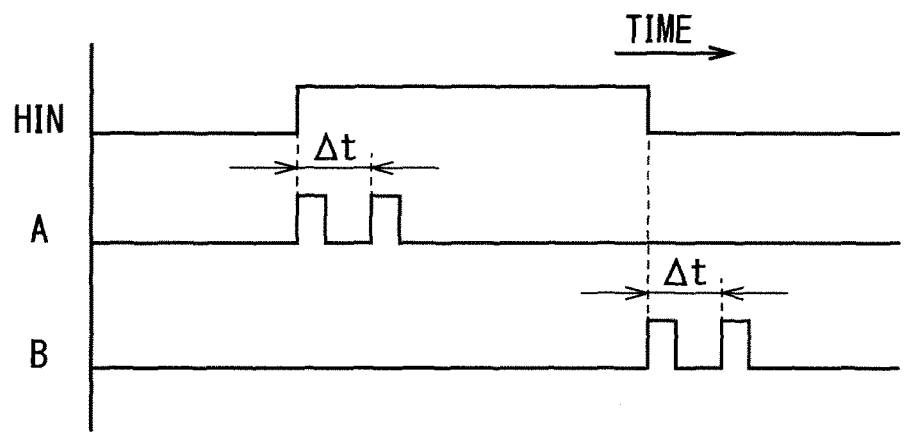
FIG. 2 is a diagram illustrating an on-pulse and an off-pulse of the HVIC of the underlying technology.

A high-side input signal HIN that is input into the high-side gate drive circuit 101 is input into the on-pulse generating circuit 11 and the off-pulse generating circuit 12. The on-pulse generating circuit 11 generates an on-pulse A synchronized with rising timing of the high-side input signal HIN. The off-pulse generating circuit 12 generates an off-pulse B synchronized with falling timing of the high-side input signal HIN. FIG. 2 illustrates relationship among the high-side input signal HIN, the on-pulse A, and the off-pulse B.

An output of the on-pulse generating circuit 11 is connected to a gate of the level shift MOSFET 176. A drain of the level shift MOSFET 176 is fixed to a high-side drive power supply voltage VB through the resistor 19, and is connected to an input terminal of the interlock circuit 23 through the NOT gate 21. A source of the level shift MOSFET 176 is grounded. When the on-pulse A is input from the on-pulse generating circuit 11 to the gate of the level shift MOSFET 176, the level shift MOSFET 176 becomes conductive and a level shift current $I_{LF}$ flows between the drain and the source of the level shift MOSFET 176.

An output of the off-pulse generating circuit 12 is connected to a gate of the level shift MOSFET 186. A drain of the level shift MOSFET 186 is fixed to a high-side drive power supply voltage \'B through the resistor 20, and is connected to an input terminal of the interlock circuit 23 through the NOT gate 22. A source of the level shift MOSFET 186 is grounded. When the off-pulse B is input from the off-pulse generating circuit 12 to the gate of the level shift MOSFET 186, the level shift MOSFET 186 becomes conductive and a level shift current $I_{LF}$ flows between the drain and the source of the level shift MOSFET 186.

When the level shift current $I_{LF}$ flows through the level shift MOSFET 176, a drain voltage of the level shift MOSFET 176 will decrease. As a result, an input signal from the NOT gate 21 to the interlock circuit 23 becomes a high level. Similarly, when the level shift current $I_{LF}$ flows through the level shift MOSFET 186, a drain voltage of the level shift MOSFET 186 will decrease. As a result, an input signal from the NOT gate 22 to the interlock circuit 23 becomes a high level.

When both of the two input signals become a high level, the interlock circuit 23 outputs the input signal that becomes a high level earlier to the latch circuit 24, and cuts off output of the other input signal.

The latch circuit 24 includes circuits such as an RS flip-flop circuit, and latches the output from the interlock circuit 23 and outputs the latched output to the output circuit 25.

When the output signal of the latch circuit 24 is a high level, the output circuit 25 outputs the high-side drive power supply voltage VB. When the output signal of the latch circuit 24 is a low level, the output circuit 25 outputs a high-side floating power supply offset voltage VS.

There is a problem that when the high-side switching element Q1 turns on or off, if a time change dV/dt occurs in a voltage between the high-side floating power supply offset voltage VS and the ground GND, this becomes noise, and a signal is not normally transmitted from a low-voltage side to a high-voltage side of the high-side gate drive circuit 101. Here, an input side of the level shift MOSFETs 176 and 186 of the high-side gate drive circuit 101 is the low-voltage side, whereas an output side is the high-voltage side.

For this problem, influence of noise may be eliminated by making a period of the on-pulse A and the on-pulse B longer than a noise period, or by causing the on-pulse A and the on-pulse B to include two pulses of a period Δt, as illustrated in FIG. 2. However, if the period of the on-pulse A and the on-pulse B becomes longer than the noise period, a loss made when a signal is transmitted to the high-voltage side will increase. Also, when the on-pulse A and the on-pulse B include two pulses of a period Δt, although the noise period varies depending on an operating environment of the high-side switching element Q1, the period Δt of the on-pulse A and the on-pulse B needs to be set constant in advance. Therefore, in particular, when the high-side input signal HIN includes a narrow-width pulse, signal transmission from the high-side input signal HIN to the high-side switching element Q1 will be delayed excessively. Therefore, there is a problem that efficiency of a gate drive system is reduced by input limitation of narrow-width pulse or increase in dead time.

For such a problem, a first preferred embodiment implements the following scheme on the high-side gate drive circuit.

<B. First Preferred Embodiment>
<B-1. Configuration and Operation>

Figure 3:
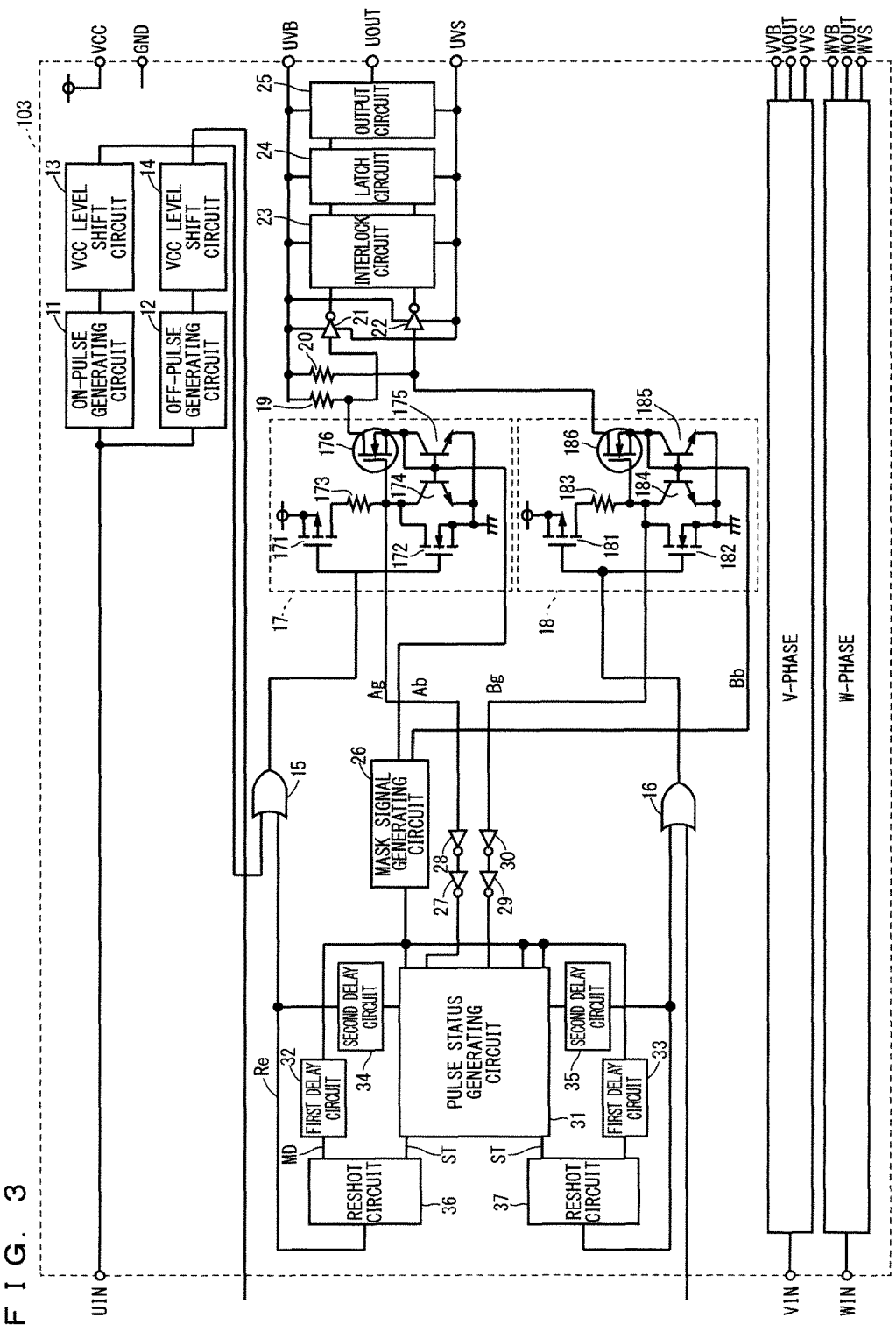
FIG. 3 is a diagram illustrating a high-side gate drive circuit of an HVIC of a first preferred embodiment.

FIG. 3 is a diagram illustrating a configuration of a high-side gate drive circuit 103 of the first preferred embodiment. In FIG. 3, the same configurations as in the underlying technology illustrated in FIG. 1 are denoted with the same reference symbols. The high-side gate drive circuit 103 drives six switching elements of three phases including a U phase, a V phase, and a W phase. In the high-side gate drive circuit 103, since circuits that drive switching elements of respective phases have similar configurations, illustration of internal configurations of V-phase and W-phase circuits is omitted in FIG. 3. By way of a typical example, the U-phase circuit configuration will be described below.

The high-side gate drive circuit 103 includes an on-pulse generating circuit 11, an off-pulse generating circuit 12, VCC level shift circuits 13 and 14, OR gates 15 and 16, VB level shift circuits 17 and 18, resistors 19 and 20, NOT gates 21 and 22, an interlock circuit 23, a latch circuit 24, an output circuit 25, a mask signal generating circuit 26, a pulse status generating circuit 31, and reshot circuits 36 and 37. In FIG. 3, UIN represents a high-side input signal, UVB represents a high-side drive power supply voltage, UVS represents a high-side floating power supply offset voltage, and UOUT represents an output terminal. Although not illustrated in FIG. 3, as in the high-side gate drive circuit 101 of FIG. 1, a high-side switching element Q1 to be driven is connected to the output terminal UOUT, and a freewheel diode D1 is connected to the high-side switching element Q1 in inverse parallel.

The on-pulse generating circuit 11 generates a one-shot pulse synchronized with the rising of the high-side input signal UIN (hereinafter referred to as "on-pulse"). The off-pulse generating circuit 12 generates a one-shot pulse synchronized with falling timing of the high-side input signal UIN (hereinafter referred to as "off-pulse"). Thus, both of the on-pulse generating circuit 11 and the off-pulse generating circuit 12 generate pulses synchronized with the high-side input signal UIN. A reference voltage for these pulses is a regulated power supply voltage VREG.

The VCC level shift circuit 13 shifts a level of the reference voltage for the on-pulse that is input from the on-pulse generating circuit 11, from the regulated power supply voltage VREG to a low-side fixed power supply voltage VCC. The VCC level shift circuit 14 shifts a level of the reference voltage for the off-pulse that is input from the off-pulse generating circuit 12, from the regulated power supply voltage VREG to the low-side fixed power supply voltage VCC. An output of the VCC level shift circuit 13 is input into the VB level shift circuit 17 through the OR gate 15. An output of the VCC level shift circuit 14 is input into the VB level shift circuit 18 through the OR gate 16.

The VB level shift circuit 17 shifts the level of the reference voltage for the on-pulse from the low-side fixed power supply voltage VCC to the high-side drive power supply voltage VB. The VB level shift circuit 17 includes an n-channel MOSFET 171, a p-channel MOSFET 172, a resistor 173, NPN-type bipolar transistors 174 and 175, and a level shift MOSFET 176. The MOSFETs 171 and 172 constitute a half bridge circuit. The resistor 173 is connected between drains of the MOSFETs 171 and 172. The bipolar transistors 174 and 175 constitute a current mirror circuit. The bipolar transistor 175 is disposed on a primary side of the current mirror circuit, and the bipolar transistor 174 is disposed on a secondary side. An emitter of the bipolar transistor 174 is connected to a drain of the MOSFET 172, and a collector of the bipolar transistor 174 is connected to a source of the MOSFET 172. A collector of the bipolar transistor 175 is connected to a source of the level shift MOSFET 176. A drain of the level shift MOSFET 176 is fixed to the high-side drive power supply voltage UVB through the resistor 19.

When an output signal of the OR gate 15 becomes a high level, the MOSFET 171 will become conductive and the level shift MOSFET 176 will become conductive. That is, the level shift MOSFET 176 is an on-side MOSFET that is driven by the on-pulse. When the level shift MOSFET 176 becomes conductive, a current will flow between the drain and the source of the level shift MOSFET 176. As a result, a high-level signal is input from the NOT gate 21 to the interlock circuit 23. On the other hand, when the output signal of the OR gate 15 becomes a low level, the MOSFET 172 will become conductive and the level shift MOSFET 176 will become non-conductive. As a result, a low-level signal is input from the NOT gate 21 to the interlock circuit 23. With this configuration, the level of the reference voltage for the on-pulse is shifted from the low-side fixed power supply voltage VCC to the high-side drive power supply voltage VB.

The VB level shift circuit 18 is a circuit that shifts the level of the reference voltage for the off-pulse from the low-side fixed power supply voltage VCC to the high-side drive power supply voltage VB. The VB level shift circuit 18 includes an n-channel MOSFET 181, a p-channel MOSFET 182, a resistor 183, NPN-type bipolar transistors 184 and 185, and a level shift MOSFET 186. The MOSFETs 181 and 182 constitute a half bridge circuit. The resistor 183 is connected between drain terminals of the MOSFETs 181 and 182. The bipolar transistors 184 and 185 constitute a current mirror circuit. The bipolar transistor 185 is disposed on a primary side of the current mirror circuit, and the bipolar transistor 184 is disposed on a secondary side. Collector-emitter of the bipolar transistor 184 is connected to drain-source of the MOSFET 182. A collector of the bipolar transistor 185 is connected to a source of the level shift MOSFET 186. A drain of the level shift MOSFET 186 is connected to the high-side drive power supply voltage UVB through the resistor 20.

When an output signal of the OR gate 16 becomes a high level, the MOSFET 181 will become conductive, and the level shift MOSFET 186 will become conductive. That is, the level shift MOSFET 186 is an off-side MOSFET that is driven by the off-pulse. When the level shift MOSFET 186 becomes conductive, a current will flow between the drain and the source of the level shift MOSFET 186. As a result, a high-level signal is input from the NOT gate 22 to the interlock circuit 23. On the other hand, when the output signal of the OR gate 16 becomes a low level, the MOSFET 182 will become conductive and the level shift MOSFET 186 will become non-conductive. As a result, a low-level signal is input from the NOT gate 22 to the interlock circuit 23. With this configuration, the level of the reference voltage for the off-pulse is shifted from the low-side fixed power supply voltage VCC to the high-side drive power supply voltage VB.

When both of the two output signals of the NOT gates 21 and 22 are a high level, the interlock circuit 23 outputs the signal that becomes a high level earlier to the latch circuit 24, and cuts off the other signal. Also, the interlock circuit 23 has a function of cutting off the output signals of both of the NOT gates 21 and 22 when a time change dV/dt (noise) occurs in a voltage between the high-side floating power supply offset voltage UVS and the ground GND. With this function, when noise occurs, output of the high-side input signal UIN to the latch circuit 24 is cut off.

The latch circuit 24 latches the output of the interlock circuit 23, and outputs the latched output to the output circuit 25. In response to the output of the latch circuit 24, the output circuit 25 switches an output voltage to the output terminal UOUT between the high-side drive power supply voltage UVB and the high-side floating power supply offset voltage UVS.

The mask signal generating circuit 26 generates a mask signal, when a time change dV/dt (noise) occurs in the voltage between the high-side floating power supply offset voltage UVS and the ground GND. The mask signal generating circuit 26 receives a base signal Ab of the bipolar transistors 174 and 175 that constitute the current mirror circuit of the VB level shift circuit 17, and a base signal Bb of the bipolar transistors 184 and 185 that constitute the current mirror circuit of the VB level shift circuit 18. Based on these base signals Ab and Bb, that is, based on base potential, the mask signal generating circuit 26 detects occurrence of noise and generates the mask signal.

Figure 4:
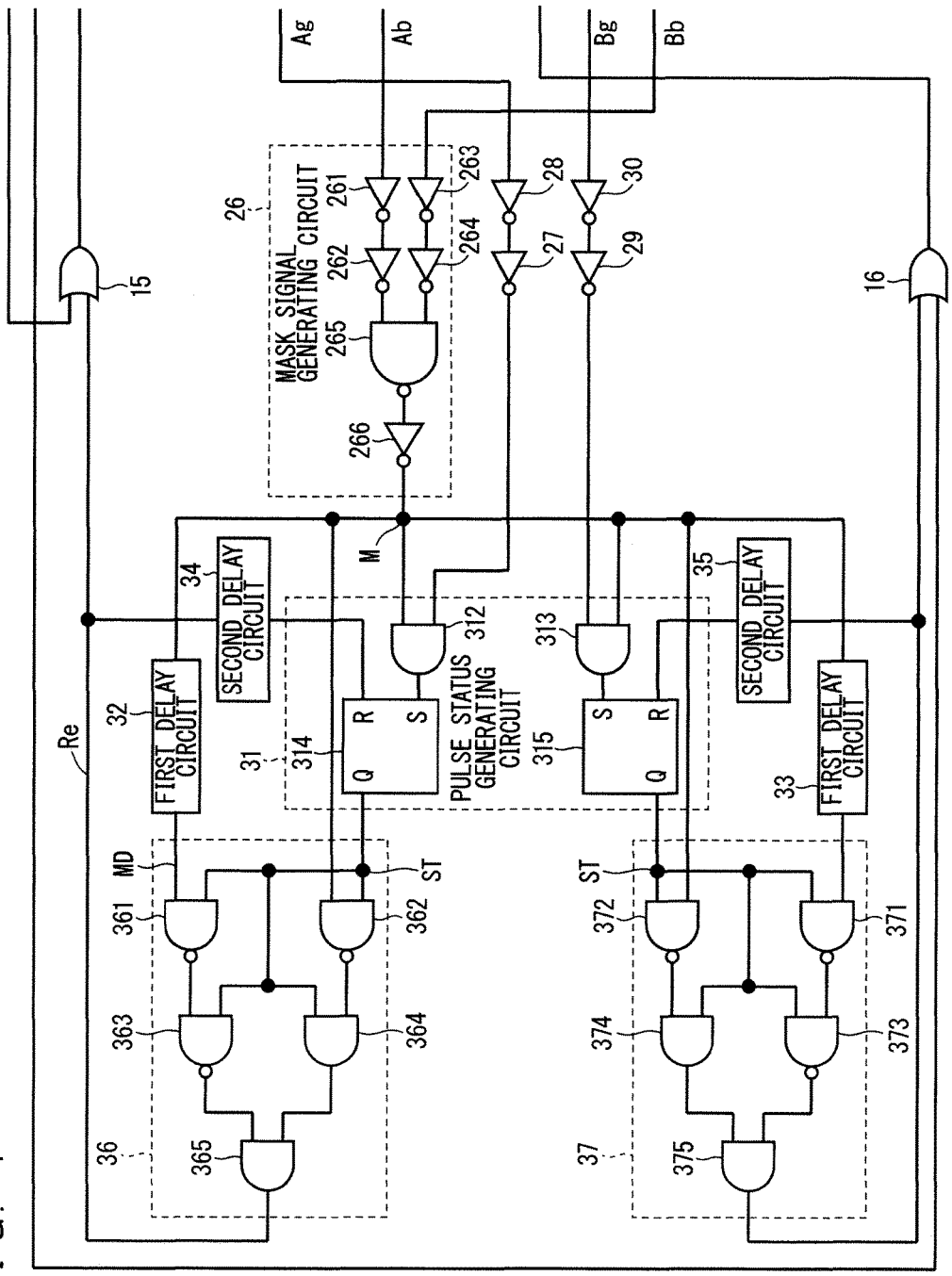
FIG. 4 is a diagram illustrating a configuration of part of the high-side gate drive circuit of the HVIC of the first preferred embodiment.
Figure 5:
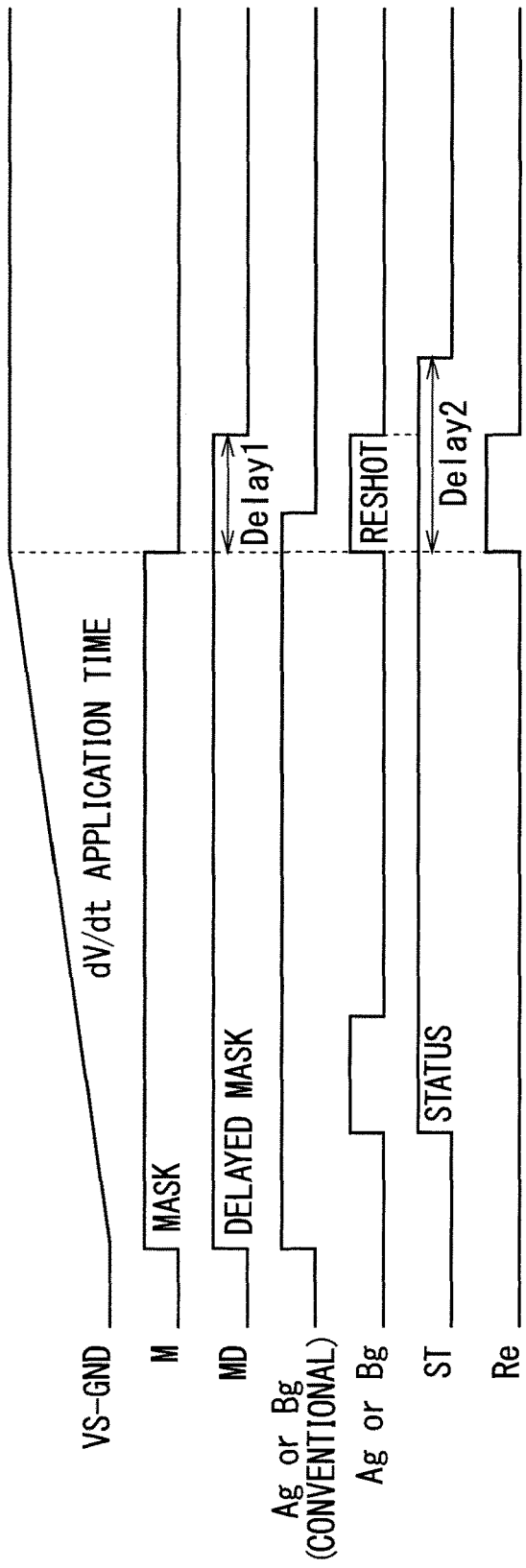
FIG. 5 is a sequence diagram of output signals of a mask signal generating circuit, a pulse status generating circuit, and reshot circuits.
Figure 6:
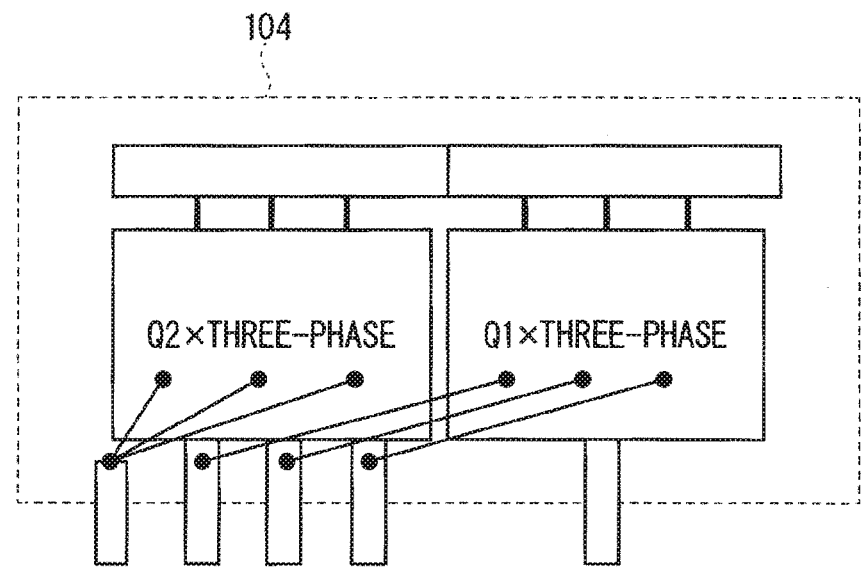
FIG. 6 is a diagram illustrating a 6 in 1 module of a second preferred embodiment.

FIG. 4 is a diagram illustrating internal configurations of the mask signal generating circuit 26, the pulse status generating circuit 31, and the reshot circuits 36 and 37. FIG. 5 is a sequence diagram of output signals of the mask signal generating circuit 26, the pulse status generating circuit 31, and the reshot circuits 36 and 37.

While a time change dV/dt occurs in the voltage between the high-side floating power supply offset voltage UVS and the ground GND, that is, while noise occurs, the mask signal generating circuit 26 generates the mask signal M that is a high level. The mask signal generating circuit 26 includes NOT gates 261, 262, 263, 264, and 266, and a NAND gate 265. The base signal Ab of the bipolar transistors 174 and 175 is input into a first input terminal of the NAND gate 265 through the two-stage NOT gates 261 and 262. The base signal Bb of the bipolar transistors 184 and 185 is input into a second input terminal of the NAND gate 265 through the two-stage NOT gates 263 and 264. An output of the NAND gate 265 is input into the NOT gate 266. The NOT gate 266 outputs the mask signal M. Therefore, the mask signal M becomes a high level when both of the base signals Ab and Bb are a high level, and becomes a low level under other conditions.

When a time change dV/dt occurs in the voltage between the high-side floating power supply offset voltage UVS and the ground GND, currents will flow through output capacitances of the level shift MOSFETs 176 and 186. Then, base potential of the current mirror circuits connected to the level shift MOSFETs 176 and 186 increases, and both of the base signals Ab and Bb become a high level. Therefore, the mask signal M becomes a high level while a time change dV/dt occurs in the voltage between the high-side floating power supply offset voltage UVS and the ground GND, that is, while noise occurs.

Here, by monitoring the base potential of the bipolar transistors that constitute the current mirror circuits, the mask signal generating circuit 26 detects occurrence of noise and generates the mask signal. However, a method of detecting occurrence of noise is not limited to this method, and the method is required to at least monitor source potential of the level shift MOSFETs 176 and 186. For example, instead of the current mirror circuits, resistors may be connected between the sources of the level shift MOSFETs 176 and 186 and the GND, and the mask signal generating circuit 26 may detect occurrence of noise by monitoring potential at both ends of the resistors. That is, the mask signal generating circuit 26 generates the mask signal M that becomes a high level in a period in which both of the source potential of the level shift MOSFET 176 that is the on-side MOSFET and the source potential of the level shift MOSFET 186 that is the off-side MOSFET become a high level.

Thus, in the high-side gate drive circuit 103, in addition to the high-voltage side interlock circuit 23 cutting off output when noise occurs, the low-voltage side mask signal generating circuit 26 monitors noise.

The pulse status generating circuit 31 determines whether the on-pulse or the off-pulse is input into the VB level shift circuit 17 or 18 during a mask period, respectively. Here, the mask period is a period in which the mask signal M is a high level. The pulse status generating circuit 31 includes AND gates 312 and 313, and RS flip-flop circuits 314 and 315.

The mask signal M is input into first input terminals of the AND gates 312 and 313. A gate signal Ag of the level shift MOSFET 176 is input into a second input terminal of the AND gate 312 through two-stage NOT gates 28 and 27. A gate signal Bg of the level shift MOSFET 186 is input into a second input terminal of the AND gate 313 through two-stage NOT gates 30 and 29.

An output of the AND gate 312 is input into a set terminal of the RS flip-flop circuit 314. An output of the AND gate 313 is input into a set terminal of the RS flip-flop circuit 315. An output signal Re of the reshot circuit 36 is input into a reset terminal of the RS flip-flop circuit 314 through a second delay circuit 34. An output signal Re of the reshot circuit 37 is input into a reset terminal of the RS flip-flop circuit 315 through a second delay circuit 35. Therefore, an output signal ST of the RS flip-flop circuit 314 becomes a high level when the gate signal Ag of the level shift MOSFET 176 becomes a high level during the mask period, and the output signal ST maintains a high level until a delay time Delay2 of the second delay circuit 34 elapses after subsequently the reshot signal Re becomes a high level. An output signal ST of the RS flip-flop circuit 315 becomes a high level when the gate signal Bg of the level shift MOSFET 186 becomes a high level during the mask period, and the output signal ST maintains a high level until a delay time Delay2 of the second delay circuit 35 elapses after subsequently the reshot signal Re becomes a high level. In other words, the pulse status generating circuit 31 generates a status signal that becomes a high level when both of the mask signal M and gate potential of the level shift MOSFETs 176 and 186 are a high level.

When the on-pulse is input into the VB level shift circuit 17 during the mask period, the reshot circuit 36 reshots the on-pulse after the mask period. The reshot circuit 36 includes NAND gates 361, 362, and 363, and AND gates 364 and 365. A delayed mask signal MD is input into a first input terminal of the NAND gate 361. This delayed mask signal MD is a signal obtained by delaying the mask signal M by a delay time Delay1 by a first delay circuit 32. The output signal ST of the RS flip-flop circuit 314 is input into a second input terminal of the NAND gate 361. The mask signal NI is input into a first input terminal of the NAND gate 362, and the output signal ST of the RS flip-flop circuit 314 is input into a second input terminal. An output terminal of the NAND gate 361 is connected to a first input terminal of the NAND gate 363. The output signal ST of the RS flip-flop circuit 314 is input into a second input terminal of the NAND gate 363. An output terminal of the NAND gate 362 is connected to a first input terminal of the AND gate 364. The output signal ST of the RS flip-flop circuit 314 is input into a second input terminal of the AND gate 364. An output terminal of the NAND gate 363 is connected to a first input terminal of the AND gate 365, and an output terminal of the AND gate 364 is connected to a second input terminal. The reshot signal Re is output from an output terminal of the AND gate 365. The reshot signal Re is connected to the OR gate 15 and the second delay circuit 34.

The reshot signal Re of the reshot circuit 36 becomes a high level when the mask signal M is a low level and the delayed mask signal MD and the output signal ST of the RS flip-flop circuit 314 are a high level. The reshot signal Re of the reshot circuit 36 becomes a low level under other conditions.

When the off-pulse is input into the VB level shift circuit 18 during the mask period, the reshot circuit 37 reshots the off-pulse after the mask period. The reshot circuit 37 includes NAND gates 371, 372, and 373, and AND gates 374 and 375. A delayed mask signal MD is input into a first input terminal of the NAND gate 371. This delayed mask signal MD is a signal obtained by delaying the mask signal M by a delay time Delay1 by a first delay circuit 33. The output signal ST of the RS flip-flop circuit 315 is input into a second input terminal of the NAND gate 371. The mask signal M is input into a first input terminal of the NAND gate 372, and the output signal ST of the RS flip-flop circuit 315 is input into a second input terminal. An output terminal of the NAND gate 371 is connected to a first input terminal of the NAND gate 373. The output signal ST of the RS flip-flop circuit 315 is input into a second input terminal of the NAND gate 373. An output terminal of the NAND gate 372 is connected to a first input terminal of the AND gate 374. The output signal ST of the RS flip-flop circuit 315 is input into a second input terminal of the AND gate 374. An output terminal of the NAND gate 373 is connected to a first input terminal of the AND gate 375, whereas an output terminal of the AND gate 374 is connected to a second input terminal. The reshot signal Re is output from an output terminal of the AND gate 375. The reshot signal Re is connected to the OR gate 16 and the second delay circuit 35.

The reshot signal Re of the reshot circuit 37 becomes a high level when the mask signal M is a low level and the delayed mask signal MD and the output signal ST of the RS flip-flop circuit 315 are a high level. The reshot signal Re of the reshot circuit 37 becomes a low level under other conditions.

The reshot signals Re of the reshot circuits 36 and 37 are input into the VB level shift circuits 17 and 18 through the OR gates 15 and 16, respectively. The reshot signal Re becomes a high level for the delay time Delay1 after the mask period, when the on-pulse is input into the VB level shift circuit 17 or when the off-pulse is input into the VB level shift circuit 18 during the mask period. In other words, when the on-pulse or the off-pulse is input into the VB level shift circuit 17 or 18 as a first pulse during the mask period, the reshot circuit 36 or 37 inputs (reshots) a second pulse, instead of the first pulse, into the VB level shift circuit 17 or 18 after the mask period, respectively.

When the status signal ST is a high level during the mask period, the reshot circuits 36 and 37 input the second pulse into the VB level shift circuits 17 and 18 after the mask period.

Thus, the high-side gate drive circuit 103 of the first preferred embodiment includes the on-pulse generating circuit 11 and the off-pulse generating circuit 12 that generate the first pulse synchronized with the input signal, and the VB level shift circuits 17 and 18 that shift the level of the reference voltage for the first pulse to the power supply voltage for the high-side switching element. The VB level shift circuits 17 and 18 include the level shift MOSFETs 176 and 186 that are driven by the first pulse, respectively. The high-side gate drive circuit 103 includes the mask signal generating circuit 26 that generates the mask signal that becomes a high level in the period in which the source potential of the level shift MOSFETs 176 and 186 is a high level, and the reshot circuits 36 and 37 that input the second pulse into the VB level shift circuits 17 and 18, respectively, after the mask period when the first pulse is input into the VB level shift circuits 17 and 18 during the mask period that is a period in which the mask signal is a high level. Thus, in the high-side gate drive circuit 103, since the first pulse that is input into the VB level shift circuits 17 and 18 during the mask period is reshot to the VB level shift circuits 17 and 18 as the second pulse after the mask period, respectively, it can be inhibited that the first pulse is not transmitted to the output circuit 25 during the mask period. Also, it is possible to make the period of the first pulse shorter than the mask period. With this configuration, when the high-side input signal HIN is a narrow-width pulse, delay of signal transmission time can be inhibited and efficiency of the gate drive system can be increased. Also, the mask period, which is determined as a period in which noise dV/dt occurs, varies depending on an operating environment of the high-side switching element. However, even if the mask period is determined in any way, it can be inhibited that a normal signal that occurs during the mask period is not transmitted to the output circuit 25.

<B-2. Wide-Bandgap Semiconductor>

The high-side switching element Q1 to be driven by the high-side gate drive circuit 103 is formed of, for example, silicon, but is not limited to silicon. The high-side switching element Q1 may be formed of a wide-bandgap semiconductor having a band gap wider than a band gap of silicon. The wide-bandgap semiconductor is, for example, silicon carbide, a gallium nitride-based material, or diamond.

The high-side switching element Q1 formed of such a wide-bandgap semiconductor, which has a high withstand voltage and high allowable current density, can be downsized. Using the downsized high-side switching element Q1 makes it possible to downsize a semiconductor module incorporating the high-side switching element Q1.

Since the wide-bandgap semiconductor can operate at a higher speed than a silicon semiconductor, the high-side switching element Q1 can operate at high frequencies. Since the high-side gate drive circuit 103 of the first preferred embodiment solves factors inhibiting high-frequency operations, such as excessive delay in signal transmission time, limitation of narrow-width pulse input, and increase in dead time tdead, the high-side gate drive circuit 103 is suitable for driving the high-side switching element Q1 formed of a wide-handgap semiconductor.

Since the high-side switching element Q1 formed of a wide-bandgap semiconductor has high heat resistance, a heat-dissipating fin of a heat sink can be downsized. Therefore, this contributes to downsizing of a semiconductor module including the high-side switching element Q1.

Since the high-side switching element Q1 formed of a wide-bandgap semiconductor has a low power loss and high efficiency, high efficiency of a semiconductor module including the high-side switching element Q1 can be achieved.

Note that the high-side switching element Q1 made of a wide-bandgap semiconductor has been described above, but the freewheel diode D1 connected in inverse parallel to the high-side switching element Q1 may be made of a wide-bandgap semiconductor. When one of the high-side switching element Q1 and the freewheel diode D1 is made of a wide-bandgap semiconductor, effects produced by the wide-bandgap semiconductor, such as downsizing, high-frequency operations, and high efficiency described above can be obtained.

<C. Second Preferred Embodiment>

FRI. 6 is a diagram illustrating a semiconductor module 104 of a second preferred embodiment. The semiconductor module 104 is a 6 in 1 module obtained by integrating six high-side gate drive circuits 103 of the first preferred embodiment into one package. The 6 in 1 module is superior to a discrete module in ease of wiring and heat-dissipating structure, and can operate at a high frequency.

<D. Third Preferred Embodiment>

A third preferred embodiment is a power conversion device to which the high-side gate drive circuit 103 of the first preferred embodiment or the semiconductor module of the second preferred embodiment is applied. While the present invention is not limited to a specified power conversion device, the third preferred embodiment will describe application of the present invention to a three-phase inverter.

Figure 7:
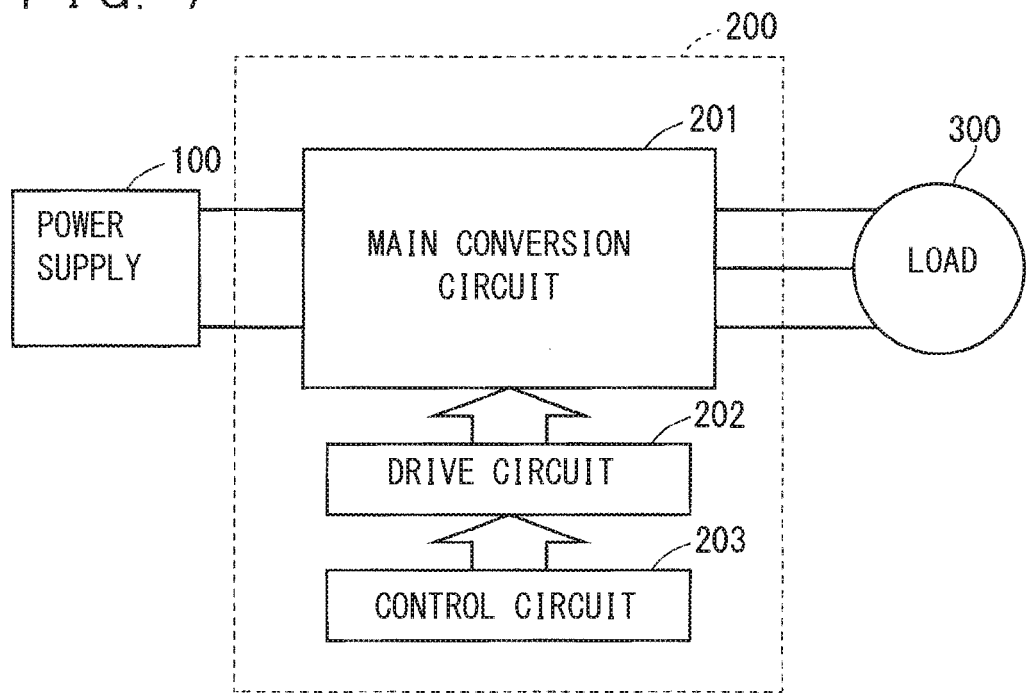
FIG. 7 is a block diagram illustrating a configuration of a power conversion system of a third preferred embodiment.

FIG. 7 is a block diagram illustrating a configuration of a power conversion system of the third preferred embodiment. The power conversion system of the third preferred embodiment includes a power supply 100, a power conversion device 200, and a load 300. The power supply 100 is a direct current (DC) power supply, and supplies DC power to the power conversion device 200. The power supply 100 can have various configurations. For example, the power supply 100 may include a DC system, a solar battery, and a storage battery, or the power supply 100 may include a rectifier circuit connected to an alternating current (AC) system or an AC/DC converter. Alternatively, the power supply 100 may include a DC/DC converter that converts DC power that is output from a DC system into predetermined electric power.

The power conversion device 200 is a three-phase inverter connected between the power supply 100 and the load 300. The power conversion device 200 converts DC power supplied from the power supply 100 into AC power, and supplies the converted AC power to the load 300. The power conversion device 200 includes a main conversion circuit 201, a drive circuit 202, and a control circuit 203, as illustrated in FIG. 7. The main conversion circuit 201 converts DC power into AC power, and outputs the converted AC power. The drive circuit 202 outputs drive signals that drive switching elements of the main conversion circuit 201. The control circuit 203 outputs, to the drive circuit 202, control signals that control the drive circuit 202.

The load 300 is a three-phase motor to be driven by the AC power supplied from the power conversion device 200. Note that the load 300 is not limited to a specified application but is a motor mounted on various electric devices, for example, a motor for a hybrid car, an electric vehicle, a railway car, an elevator, or an air-conditioner.

Details of the power conversion device 200 will be described below. The main conversion circuit 201 includes switching elements and freewheel diodes (not illustrated). The switching elements, through switching, convert DC power supplied from the power supply 100 into AC power, and supply the converted AC power to the load 300. While the main conversion circuit 201 may have various specific circuit configurations, the main conversion circuit 201 according to the present preferred embodiment is a two-level three-phase full bridge circuit, and includes six switching elements and six freewheel diodes connected in inverse parallel to the switching elements. Of the six switching elements, each two switching elements are connected in series and constitute upper and lower arms. The upper and lower arms constitute phases of the full bridge circuit (U phase, V phase, W phase). Then, output terminals of the upper and lower arms, that is, three output terminals of the main conversion circuit 201 are connected to the load 300.

The drive circuit 202 generates the drive signals that drive the switching elements of the main conversion circuit 201, and supplies the drive signals to control electrodes of the switching elements of the main conversion circuit 201. More specifically, in response to the control signals from the control circuit 203 to be described later, the drive circuit 202 outputs the drive signals that turn on the switching elements and the drive signals that turn off the switching elements to the control electrodes of the switching elements. To maintain the switching element in an on state, the drive signal is a voltage signal equal to or higher than a threshold voltage of the switching element (on signal). To maintain the switching element in an off state, the drive signal is a voltage signal equal to or lower than the threshold voltage of the switching element (off signal). The above-described high-side gate drive circuit 103 of the first preferred embodiment is applied to the drive circuit 202.

The control circuit 203 controls the switching elements of the main conversion circuit 201 such that desired electric power is supplied to the load 300. More specifically, the control circuit 203 calculates a time when each switching element of the main conversion circuit 201 is to be in an on state (on time) based on electric power to be supplied to the load 300. The control circuit 203 can control the main conversion circuit 201, for example, by PWM control that modulates the on time of the switching element in accordance with a voltage to be output. The control circuit 203 then outputs a control command (control signals) to the drive circuit 202 so as to output the on signal to the switching element that is to be in an on state at each time, and to output the off signal to the switching element that is to be in an off state. In response to these control signals, the drive circuit 202 outputs the on signal or the off signal as the drive signal to the control electrode of each switching element.

In the power conversion device according to the present preferred embodiment, since the high-side gate drive circuit 103 of the first preferred embodiment is applied to the drive circuit 202, a loss and temperature rise of the HVIC can be reduced, and in particular, a semiconductor device (module) and a system that operate at high frequencies can be implemented.

While the present preferred embodiment has described an example in which the present invention is applied to the two-level three-phase inverter, the present invention is not limited to this example and can be applied to various power conversion devices. While the present preferred embodiment has described the two-level power conversion device, the present invention may be applied to a three-level or multilevel power conversion device. When electric power is supplied to a single-phase load, the present invention may be applied to a single-phase inverter. In addition, when electric power is supplied to a DC load or the like, the present invention is also applicable to a DC/DC converter or an AC/DC converter.

Also, the load 300 of the power conversion device 200 is not limited to a motor. For example, the power conversion device 200 may be used as a power supply device for an electrical discharge machine, a laser beam machine, an induction heating cooking device, or a non-contact power supply system, and may be used as a power conditioner for a solar power generation system r a power storage system.

Note that in the present invention, modifications and omissions may be made to the preferred embodiments as appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A high-side gate drive circuit for driving a high-side switching element, the high-side gate drive circuit comprising:
   pulse generating circuits configured to generate a first pulse synchronized with an input signal; and
   level shift circuits configured to shift a level of a reference voltage for the first pulse to a power supply voltage of the high-side switching element,
   wherein the level shift circuits include MOSFETs to be driven by the first pulse,
   the high-side gate drive circuit comprising:
   a mask signal generating circuit configured to generate a mask signal that becomes a high level in a period in which source potential of the MOSFETs becomes a high level; and
   reshot circuits configured, when the first pulse is input into the level shift circuits during a mask period that is a period in which the mask signal is a high level, to input a second pulse into the level shift circuits after the mask period.

2. The high-side gate drive circuit according to claim 1, wherein
   the level shift circuits further include current mirror circuits in which primary sides are connected to source terminals of the MOSFETs, and
   base signals of bipolar transistors that constitute the current mirror circuits are input into the mask signal generating circuit.

3. The high-side gate drive circuit according to claim 2, further comprising a pulse status generating circuit configured to generate status signals that become a high level when both of the mask signal and gate potential of the MOSFETs are a high level,
   wherein when the status signals are a high level during the mask period, the reshot circuits input the second pulse into the level shift circuits after the mask period.

4. The high-side gate drive circuit according to claim 2, wherein
   the first pulse includes an on-pulse synchronized with a rising edge of the input signal, and an off-pulse synchronized with a falling edge of the input signal,
   the MOSFETs include an on-side MOSFET to be driven by the on-pulse, and an off-side MOSFET to be driven by the off-pulse, and the mask signal generating circuit generates the mask signal that becomes a high level in a period in which both source potential of the on-side MOSFET and source potential of the off-side MOSFET become a high level.

5. The high-side gate drive circuit according to claim 2, wherein the high-side switching element is a wide-bandgap semiconductor.

6. The high-side gate drive circuit according to claim 1, further comprising a pulse status generating circuit configured to generate status signals that become a high level when both of the mask signal and gate potential of the MOSFETs are a high level,
   wherein when the status signals are a high level during the mask period, the reshot circuits input the second pulse into the level shift circuits after the mask period.

7. The high-side gate drive circuit according to claim 6, wherein
   the first pulse includes an on-pulse synchronized with a rising edge of the input signal, and an off-pulse synchronized with a falling edge of the input signal,
   the MOSFETs include an on-side MOSFET to be driven by the on-pulse, and an off-side MOSFET to be driven by the off-pulse, and
   the mask signal generating circuit generates the mask signal that becomes a high level in a period in which both source potential of the on-side MOSFET and source potential of the off-side MOSFET become a high level.

8. The high-side gate drive circuit according to claim 6, wherein the high-side switching element is a wide-bandgap semiconductor.

9. The high-side gate drive circuit according to claim 1, wherein
   the first pulse includes an on-pulse synchronized with a rising edge of the input signal, and an off-pulse synchronized with a falling edge of the input signal,
   the MOSFETs include an on-side MOSFET to be driven by the on-pulse, and an off-side MOSFET to be driven by the off-pulse, and
   the mask signal generating circuit generates the mask signal that becomes a high level in a period in which both source potential of the on-side MOSFET and source potential of the off-side MOSFET become a high level.

10. The high-side gate drive circuit according to claim 9, wherein the high-side switching element is a wide-bandgap semiconductor.

11. The high-side gate drive circuit according to claim 1, wherein the high-side switching element is a wide-bandgap semiconductor.

12. A semiconductor module comprising six high-side gate drive circuits according to claim 1 integrated into one package.

13. A three-phase inverter system comprising the high-side gate drive circuit according to claim 1.

* * * * *